United States Patent
Guo

(10) Patent No.: US 9,893,098 B2
(45) Date of Patent: *Feb. 13, 2018

(54) ARRAY SUBSTRATE AND FABRICATION METHOD THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Jian Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/262,523

(22) Filed: Sep. 12, 2016

(65) Prior Publication Data

US 2017/0025450 A1    Jan. 26, 2017

Related U.S. Application Data

(63) Continuation of application No. 14/429,961, filed as application No. PCT/CN2014/082569 on Jul. 21, 2014, now Pat. No. 9,466,624.

(30) Foreign Application Priority Data

Oct. 17, 2013 (CN) .......................... 2013 1 0486484

(51) Int. Cl.
*H01L 27/12* (2006.01)
*G02F 1/1368* (2006.01)
*H01L 27/32* (2006.01)

(52) U.S. Cl.
CPC ........ *H01L 27/1288* (2013.01); *G02F 1/1368* (2013.01); *H01L 27/124* (2013.01);
(Continued)

(58) Field of Classification Search
CPC ... H01L 27/124; H01L 27/1288; H01L 27/12; H01L 27/1214; H01L 27/1259; H01L 29/7869; H01L 29/41733
See application file for complete search history.

(56) References Cited

U.S. PATENT DOCUMENTS

2007/0298554 A1* 12/2007 Long ................ G02F 1/136227
                                                            438/160
2009/0111119 A1    4/2009 Fujikawa et al.
(Continued)

FOREIGN PATENT DOCUMENTS

CN    101656232 A    2/2010
CN    102629588 A    8/2012
(Continued)

OTHER PUBLICATIONS

First Chinese Office Action dated Feb. 16, 2015; Appln. No. 201310486484.0.
(Continued)

*Primary Examiner* — Jaehwan Oh
(74) *Attorney, Agent, or Firm* — Ladas & Parry LLP

(57) ABSTRACT

Embodiments of the present disclosure provide an array substrate and a fabrication method thereof, and a display device. The fabrication method of the array substrate includes: forming a gate metal layer, a gate insulating layer, an active layer and a source-drain metal layer on a base substrate. The forming the gate insulating layer, the active layer and the source-drain metal layer on the base substrate comprises: forming a gate insulating film, an active layer film and a source-drain metal film on the base substrate;
(Continued)

forming the gate insulating layer, the active layer and the source-drain metal layer by a single patterning process. The number of the exposing process is reduced, the production cycle is shortened and the fabrication cost is reduced.

16 Claims, 3 Drawing Sheets

(52) U.S. Cl.
CPC .. *G02F 2201/121* (2013.01); *G02F 2201/123* (2013.01); *G02F 2201/124* (2013.01); *H01L 27/3276* (2013.01)

(56) References Cited

U.S. PATENT DOCUMENTS

| | | | | |
|---|---|---|---|---|
| 2009/0111198 A1* | 4/2009 | Fujikawa | ............ | H01L 21/0273 438/22 |
| 2009/0167975 A1* | 7/2009 | Lee | ............ | G02F 1/13458 349/43 |
| 2010/0003776 A1* | 1/2010 | Park | ............ | G02F 1/13458 438/30 |
| 2010/0165227 A1* | 7/2010 | Liu | ............ | H01L 29/78618 349/43 |
| 2011/0042676 A1* | 2/2011 | Ren | ............ | G02F 1/13624 257/59 |
| 2011/0068341 A1* | 3/2011 | Li | ............ | H01L 27/12 257/59 |
| 2012/0119210 A1* | 5/2012 | Lin | ............ | H01L 27/1214 257/57 |
| 2012/0171822 A1* | 7/2012 | Yuan | ............ | H01L 21/0274 438/166 |
| 2015/0187825 A1* | 7/2015 | Xu | ............ | H01L 27/1288 438/158 |
| 2015/0243681 A1* | 8/2015 | Sung | ............ | H01L 27/1288 257/72 |

FOREIGN PATENT DOCUMENTS

| | | |
|---|---|---|
| CN | 102651343 A | 8/2012 |
| CN | 102931139 A | 2/2013 |
| CN | 103077944 A | 5/2013 |
| CN | 103137558 A | 6/2013 |
| CN | 103208491 A | 7/2013 |
| CN | 103219284 A | 7/2013 |
| CN | 103353699 A | 10/2013 |
| CN | 103500730 A | 1/2014 |
| JP | 2012-014098 A | 1/2012 |

OTHER PUBLICATIONS

Second Chinese Office Action dated Aug. 14, 2014; Appln. No. 201310486484.0.
Third Chinese Office Action dated Jan. 18, 2016; Appln. No. 201310486484.0.
Written Opinion of International Searching Authority dated Oct. 22, 2014; PCT/CN2014/0862569.
International Search Report dated Oct. 2014; PCT/CN2014/082569.
USPTO NFOA dated Jan. 20, 2016 in connection with U.S. Appl. No. 14/429,961.
USPTO NOA mailed Jun. 14, 2016 in connection with U.S. Appl. No. 14/429,961.

* cited by examiner

ARRAY SUBSTRATE AND FABRICATION METHOD THEREOF, AND DISPLAY DEVICE

TECHNICAL FIELD

Embodiments of the disclosure relate to an array substrate and a fabrication method thereof, and a display device.

BACKGROUND

Liquid crystal display device comprises an array substrate, a color filter substrate and a liquid crystal disposed between the array substrate and the color filter substrate. As shown in FIG. 1, the array substrate comprises a base substrate 11, and a gate metal layer, a gate insulating layer 15, an active layer 14 and a source-drain metal layer disposed on the base substrate 11. The gate metal layer comprises a gate electrode 121 and a pad 122. The gate insulating layer 15 is provided with a via hole, through which an electrical connection with the pad 122 is implemented. The source-drain metal layer comprises a source electrode 132 and a drain electrode 133. The drain electrode 133 is connected with a pixel electrode 16, so that the pixel electrode 16 is charged to implement image display. The fabrication of the array substrate generally requires six patterning processes, so that the number of patterning processes is large, the fabrication cycle is long and the fabrication cost is high.

SUMMARY

According to the embodiments of the disclosure, a fabrication method of an array substrate is provided. The method comprises: forming a gate metal layer, a gate insulating layer, an active layer and a source-drain metal layer on a base substrate. The forming the gate insulating layer, the active layer and the source-drain metal layer on the base substrate comprises: forming a gate insulating film, an active layer film, and a source-drain metal film on the base substrate; and forming the gate insulating layer, the active layer and the source-drain metal layer by a single patterning process.

For example, the array substrate comprises a display pixel region, a connection region and an isolation region, the display pixel region is configured for displaying an image, the connection region is provided with a via hole, the via hole is configured for implementing an electrical connection, and the isolation region is configured for disconnecting a portion of the source-drain metal layer in the display pixel region from a portion of the source-drain metal layer in the connection region; and the gate metal layer at least comprises a gate electrode and a pad, the source-drain metal layer at least comprises a source electrode and a drain electrode, and the active layer comprises an active layer pattern.

For example, the forming the gate insulating layer, the active layer and the source-drain metal layer by the single patterning process comprises the steps of: coating a photoresist on the base substrate provided with the gate insulating film, the active layer film, and the source-drain metal film; exposing and developing the base substrate provided with photoresist by using a multi-tone mask to form a first photoresist-reserved-portion, a second photoresist-reserved-portion, a third photoresist-reserved-portion, and a photoresist-completely-removed-region; wherein the photoresist in the first photoresist-reserved-portion is completely reserved, the photoresist in the second photoresist-reserved-portion and the third photoresist-reserved-portion are partially reserved, a thickness of the photoresist in the second photoresist-reserved-portion is smaller than that in the first photoresist-reserved-portion, a thickness of the photoresist in the third photoresist-reserved-portion is smaller than that in the second photoresist-reserved-portion, the first photoresist-reserved-portion at least corresponds to a region for forming the source electrode and the drain electrode, the second photoresist-reserved-portion corresponds to a region for forming a channel, and the third photoresist-reserved-portion at least corresponds to a region for forming a pixel electrode, and the photoresist at a position of the via hole in the connection region is completely removed; etching at least the source-drain metal film, the active layer film and a portion of the gate insulating film located in the photoresist-completely-removed-region; performing an ashing treatment on the first photoresist-reserved-portion, the second photoresist-reserved-portion and the third photoresist-reserved-portion to remove the third photoresist-reserved-portion; etching at least the source-drain metal film located in the third photoresist-reserved-portion; performing an ashing treatment on the first photoresist-reserved-portion and the second photoresist-reserved-portion to remove the second photoresist-reserved-portion; etching at least the source-drain metal film located in the second photoresist-reserved-portion; and stripping remaining photoresist.

For example, the photoresist in the first photoresist-reserved-portion is completely reserved and has a thickness smaller than 1.5 μm.

For example, the thickness of the photoresist in the second photoresist-reserved-portion is 70% of that in the first photoresist-reserved-portion.

For example, the thickness of the photoresist in the third photoresist-reserved-portion is 30%-40% of that in the first photoresist-reserved-portion.

For example, the first photoresist-reserved-portion further corresponds to a region in the connection region except the via hole.

For example, the third photoresist-reserved-portion further corresponds to the isolation region.

For example, the source-drain metal film, the active layer film and the portion of the gate insulating film located in the photoresist-completely-removed-region are etched; and the etching at least the source-drain metal film located in the second photoresist-reserved-portion is: etching the source-drain metal film and a portion of the active layer film located in the second photoresist-reserved-portion, and at the same time, etching away the gate insulating film reserved in the photoresist-completely-removed-region.

For example, the etching at least the source-drain metal film, the active layer film, and the portion of the gate insulating film located in the photoresist-completely-removed-region is: removing the source-drain metal film located in the photoresist-completely-removed-region by wet etching; removing the active layer film and the portion of the gate insulating film in the photoresist-completely-removed-region by dry etching.

For example, removing the active layer film and the portion of the gate insulating film in the photoresist-completely-removed-region by dry etching is: etching the active layer with SF6 and CL2; and etching the gate insulating film with SF6 and O2 after the active layer film has been etched.

For example, an inert gas is added in the case that the active layer is etched with SF6 and CL2.

For example, the inert gas is He.

For example, a pressure is maintained below 100 pa in the case that the active layer is etched with SF6 and CL2.

For example, a total gas flow rate is controlled below 1500 sccm in the case that the active layer is etched with SF6 and CL2.

For example, O2 accounts for 40% or less of a gas mixture of SF6 and O2 in terms of gas flow rate in the case that the gate insulating film is etched with SF6 and O2.

For example, a total gas flow rate is controlled below 1200 sccm in the case that the gate insulating film is etched with SF6 and O2.

For example, the method further comprises: forming a pixel electrode and a common electrode on the base substrate, and the pixel electrode and the common electrode form an electric field therebetween.

For example, the pixel electrode and/or the common electrode comprise strip electrodes.

According to the embodiments of the disclosure, an array substrate is provided. The array substrate comprises: a gate metal layer, a gate insulating layer, an active layer and a source-drain metal layer. The gate insulating layer, the active layer and the source-drain metal layer are formed by a single patterning process.

For example, the array substrate comprises a display pixel region, a connection region and an isolation region, the display pixel region is configured for displaying an image, the connection region is provided with a via hole which runs through the source-drain metal layer, the active layer and the gate insulating layer, and the isolation region is configured for disconnecting a portion of the source-drain metal layer in the display pixel region from a portion of the source-drain metal layer in the connection region.

For example, the source-drain metal layer covers the connection region except the via hole.

For example, the active layer covers the display pixel region, the connection region except the via hole, and the isolation region.

For example, the array substrate further comprises: a pixel electrode and a common electrode, wherein the pixel electrode and the common electrode form an electric field therebetween.

For example, the pixel electrode and/or the common electrode comprises strip electrodes.

According to the embodiments of the disclosure, a display device is provided. The display device comprises the array substrate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

Figure 1:
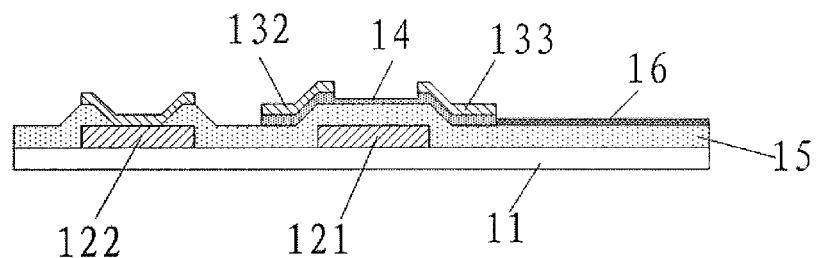
FIG. 1 is a cross-sectional schematic view illustrating an array substrate according to one technique.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiments of the present disclosure provide a fabrication method of an array substrate. The method comprises: forming a gate metal layer, a gate insulating layer, an active layer and a source-drain metal layer on a base substrate. The forming the gate insulating layer, the active layer and the source-drain metal layer on the base substrate comprises: forming a gate insulating film, an active layer film and a source-drain metal film on the base substrate; and forming the gate insulating layer, the active layer and the source-drain metal layer by a single patterning process.

In the embodiments of the present disclosure, it is necessary to clarify definitions of a "film", a "layer" and a "pattern", as well as relationships thereof. The "film" refers to a layer of film made of a certain material on the substrate by deposition or other processes. If the "film" does not need to undergo any patterning process in the entire fabrication process, the "film" is also referred to as a "layer"; if the "film" needs to undergo a patterning process in the entire fabrication process, the "film" is referred to as a "film" before the patterning process and is referred to as a "layer" after the patterning process. The "layer" after the patterning process is performed comprises at least one "pattern".

Exemplarily, the above-described gate metal layer is formed by depositing a gate metal film on the base substrate and then performing a patterning process on the gate metal film, the gate metal layer comprises a gate electrode, a gate line and a pad, and the gate electrode, the gate line and the pad are referred to as "patterns".

The so-called "patterning process" is a process of forming a film into a layer comprising at least one pattern. In the embodiments of the present disclosure, "a single patterning process" refers to a process of forming the layer comprising at least one pattern, in which an exposing process is performed only once. In the related art, the gate insulating layer, the active layer and the source-drain metal layer are formed respectively by the single patterning process, that is, three patterning processes are performed totally. In the fabrication method of the array substrate according to the embodiments of the present disclosure, the gate insulating layer, the active layer and the source-drain metal layer are formed by the single patterning process, i.e., the gate insulating layer, the active layer and the source-drain metal layer are formed by performing the exposing process only once.

In the fabrication method of the array substrate according to the embodiments of the present disclosure, the gate insulating layer, the active layer and the source-drain metal layer are formed on the array substrate by performing the exposing process only once; compared with a case where the gate insulating layer, the active layer and the source-drain metal layer are formed respectively by the single patterning process, the number of the exposing process is reduced, the number of the steps comprised in the method is reduced, the production cycle is shortened and the fabrication cost is reduced.

For example, the gate metal layer at least comprises a gate electrode and a pad, the source-drain metal layer at least comprises a source electrode and a drain electrode, and the active layer comprises an active layer pattern.

The array substrate comprises a display pixel region, a connection region and an isolation region. The display pixel region is configured for displaying an image, the connection region is provided with a via hole and the via hole is configured for implementing an electrical connection, and the isolation region is configured for disconnecting a portion of the source-drain metal layer in the display pixel region from a portion of the source-drain metal film in the connection region.

Figure 2:
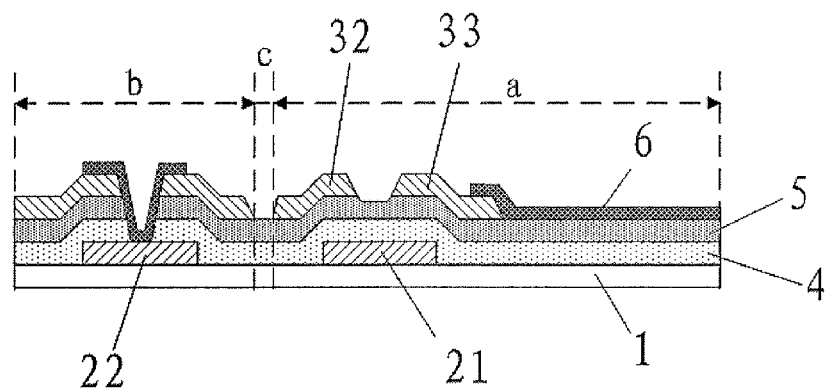
FIG. 2 is a cross-sectional schematic view illustrating an array substrate according to embodiments of the present disclosure.

With reference to a cross-sectional view of the array substrate shown in FIG. 2, the array substrate comprises the display pixel region a, the connection region b and the isolation region c. The display pixel region a is provided with a thin film transistor acting as a switch element, the thin film transistor comprising the gate electrode 21, the source electrode 32 and the drain electrode 33, and the drain electrode 33 is connected with a pixel electrode 6. The connection region b is mainly configured for providing the via hole to implement the electrical connection with a bottom film or pattern. The isolation region c is configured for disconnecting a portion of a layer in the connection region b from a portion of such layer in the display pixel region a. For example, the isolation region c disconnects the portion of the source-drain metal layer in the connection region b from the portion of the source-drain metal layer in the display pixel region a. It should be noted that the connection region may be located at the edge of the base substrate; for example, the gate metal layer comprises the pad 22 located in the connection region, and the pad 22 provided at the edge of the base substrate is electrically connected with an external drive circuit through the via hole.

It should be noted that, the accompanying drawings only illustrate films or layers associated with the embodiments of the present disclosure. For example, FIG. 2 only illustrates a partial cross-sectional view of the array substrate, and the gate metal layer at least comprises the gate electrode and the pad. In fact, the gate metal layer further comprises a gate line and a common electrode line, which are not shown in FIG. 2. The source-drain metal layer at least comprises the source electrode 32 and the drain electrode 33; in fact, the source-drain metal layer further comprises a data line and a pattern disposed in the source-drain metal layer in the connection region.

For example, the forming the gate insulating layer, the active layer and the source-drain metal layer by the single patterning process comprises the following steps.

Step S101: coating a photoresist on the base substrate provided with the gate insulating film, the active layer film, and the source-drain metal film.

Figure 3:
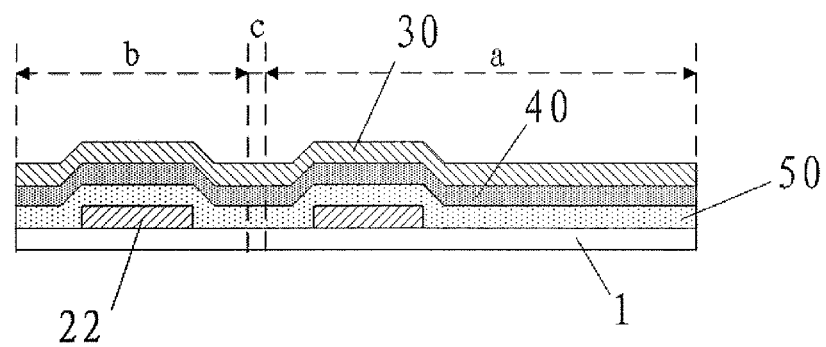
FIG. 3 is a schematic view illustrating forming a gate insulating film, an active layer film, and a source-drain metal film on a base substrate in a fabrication method of an array substrate according to embodiments of the present disclosure.

It should be noted that, the base substrate may further be provided with other films or layers; for example, the base substrate is further provided with the gate metal layer. As shown in FIG. 3, the base substrate 1 is sequentially provided with the gate insulating film 50, the active layer film 40, and the source-drain metal film 30. The gate insulating film, the active layer film, and the source-drain metal film may be formed by using a method such as deposition, and the specific method for forming them will not be limited by the embodiments of the present disclosure.

Step S102: exposing and developing the base substrate provided with photoresist by using a multi-tone mask to form a first photoresist-reserved-portion, a second photoresist-reserved-portion, a third photoresist-reserved-portion, and a photoresist-completely-removed-region. The photoresist in the first photoresist-reserved-portion is completely reserved, the photoresist in the second photoresist-reserved-portion and the third photoresist-reserved-portion are partially reserved, a thickness of the photoresist in the second photoresist-reserved-portion is smaller than that in the first photoresist-reserved-portion, and a thickness of the photoresist in the third photoresist-reserved-portion is smaller than that in the second photoresist-reserved-portion. The first photoresist-reserved-portion at least corresponds to a region for forming the source electrode and the drain electrode, the second photoresist-reserved-portion corresponds to a region for forming a channel, and the third photoresist-reserved-portion at least corresponds to a region for forming the pixel electrode; and the photoresist at a position of the via hole in the connection region is completely removed.

Figure 4:
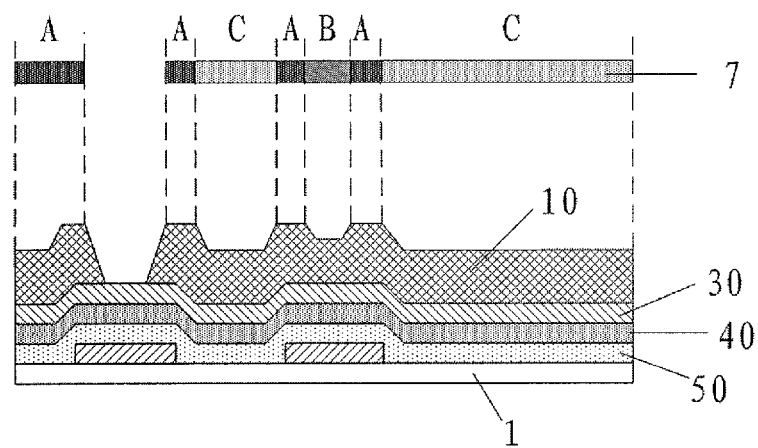
FIG. 4 is a schematic view after exposing and developing processes are preformed by using a multi-tone mask in the fabrication method of the array substrate according to the embodiments of the present disclosure.

As shown in FIG. 4, the multi-tone mask 7 comprises: a completely transmissive region, a partially transmissive region B, a partially transmissive region C and a non-transmissive region A. Transmittance of the partially transmissive region C is greater than transmittance of the partially transmissive region B. The non-transmissive region A corresponds to the first photoresist-reserved-portion, i.e., the photoresist in this region is completely reserved; the partially transmissive region B corresponds to the second photoresist-reserved-portion, and the thickness of the photoresist in the second photoresist-reserved-portion is smaller than that in the first photoresist-reserved-portion; the partially transmissive region C corresponds to the third photoresist-reserved-portion, and since the transmittance of the partially transmissive region C is greater than the transmittance of the partially transmissive region B, the thickness of the photoresist in the third photoresist-reserved-portion is smaller than that in the second photoresist-reserved-portion. It should be noted that, the photoresist originally coated on the substrate provided with the gate insulating film, the active layer film and the source-drain metal film has a uniform thickness; and after the exposing and developing processes are performed, the photoresist has different thicknesses depending on the transmittances of the respective regions of the mask. For example, the thickness of photoresist of the second photoresist-reserved-portion is 70% of the thickness of photoresist of the first photoresist-reserved-portion, the thickness of photoresist of the third photoresistreserved-portion is 30%-40% of the thickness of photoresist of the first photoresist-reserved-portion. For example, the photoresist completely-reserved portion (i.e., the first photoresist-reserved-portion) has a thickness smaller than 1.5 µm, to ensure that the formed via hole has a normal angle of slope.

If the photoresist is a positive photoresist, the non-transmissive region of the multi-tone mask corresponds to the photoresist-completely-reserved-portion, the partially transmissive regions correspond to the photoresist-partially-reserved-portions, and the photoresist corresponding to the completely transmissive region is completely removed. In the embodiments of the present disclosure, the positive photoresist is described as an example.

If the photoresist is a negative photoresist, the completely transmissive region of the multi-tone mask corresponds to the photoresist-completely-reserved-portion, the partially transmissive regions correspond to the photoresist-partially-reserved-portions, and the photoresist in the non-transmissive region is completely removed.

As shown in FIG. 4, the first photoresist-reserved-portion at least corresponds to the region for forming the source electrode and the drain electrode, and the first photoresist-reserved-portion further corresponds to a region in the connection region except the via hole; the third photoresist-reserved-portion at least corresponds to the region for forming the pixel electrode, and the third photoresist-reserved-portion further corresponds to the isolation region; and the photoresist at the position of the via hole in the connection region is completely removed.

Step S103: etching at least the source-drain metal film, the active layer film and a portion of the gate insulating film located in the photoresist-completely-removed-region.

Figure 5:
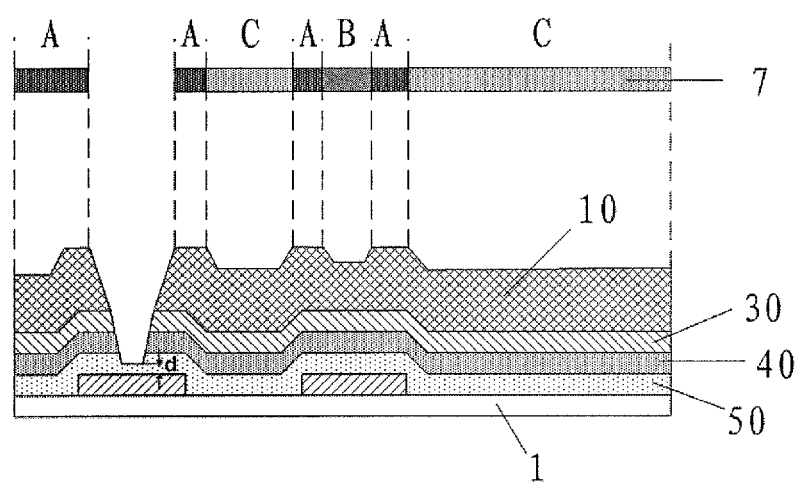
FIG. 5 is a schematic view after the source-drain metal film, the active layer film and the gate insulating film in a photoresist-completely-removed region are etched in the fabrication method of the array substrate according to the embodiments of the present disclosure.

It should be noted that, as shown in FIG. 5, the etching at least the source-drain metal film, the active layer film and a portion of the gate insulating film located in the photoresist-completely-removed-region may be etching the source-drain metal film, the active layer film and a portion of the gate insulating film located in the photoresist completely-removed-region. As shown in FIG. 5, the gate insulating film with a thickness of d is remained in the photoresist-completely-removed-region. In the embodiments of the present disclosure, the case shown in FIG. 5 that a portion of the gate insulating film in the photoresist completely-removed-region is etched is described an example.

Further, the etching at least the source-drain metal film, the active layer film and a portion of the gate insulating film located in the photoresist completely-removed-region may be etching the source-drain metal film, the active layer film, and the gate insulating film located in the photoresist completely-removed-region. That is, the source-drain metal film, the active layer film and the gate insulating film in the photoresist-completely-removed-region are completely removed, to expose the gate metal layer.

For example, the source-drain metal film located in the photoresist-completely-removed-region is removed by wet etching; and the active layer film and a portion of the gate insulating film in the photoresist-completely-removed-region are removed by dry etching. According to the embodiments of the present disclosure, etching of double films, i.e., etching of the active layer film and the gate insulating film at the same time, can be implemented by dry etching.

At first, the active layer is etched with $SF_6$ and $CL_2$, and inert gas such as He is added as a stabilizing gas; and in the etching process, a pressure is maintained below 100 pa and a total gas flow rate is controlled below 1500 sccm, to prevent the active layer from forming a chamfering. After the active layer film has been etched, the gate insulating film is etched with $SF_6$ and $O_2$; $O_2$ accounts for 40% or less of the gas mixture of $SF_6$ and $O_2$ in terms of gas flow rate and the total gas flow rate is controlled below 1200 sccm, so as to implement etching of the gate insulating layer and protect morphology of the via hole in the active layer. The wording "below" in the embodiments of the present disclosure is understood to include the specific number itself.

Step S104: performing an ashing treatment on the first photoresist-reserved-portion, the second photoresist-reserved-portion and the third photoresist-reserved-portion to remove the third photoresist-reserved-portion.

Figure 6:
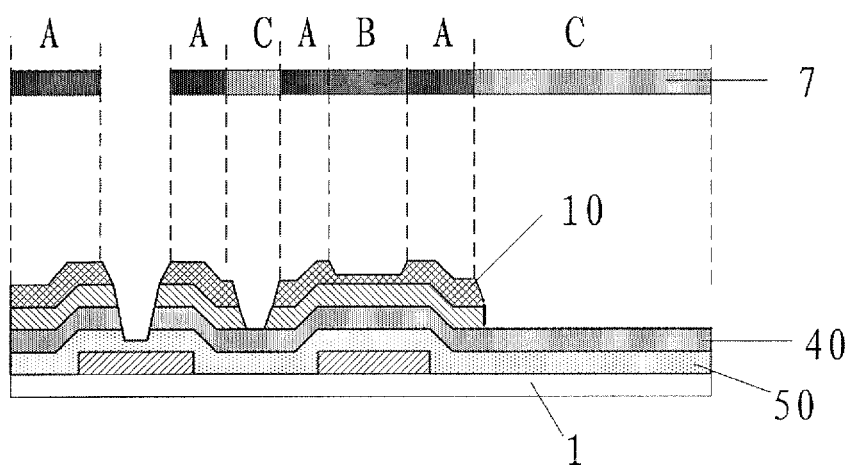
FIG. 6 is a schematic view after the source-drain metal film and the active layer in a third photoresist-reserved-portion are etched in the fabrication method of the array substrate according to the embodiments of the present disclosure.

The "ashing treatment" is to thin the whole of the photoresist; as shown in FIG. 6, the photoresist corresponding to the region C is completely removed and the photoresist corresponding to the region A and the region B are still reserved but with a reduced thickness.

Step S105: etching at least the source-drain metal film located in the third photoresist-reserved-portion.

As shown in FIG. 6, the source-drain metal film located in the third photoresist-reserved-portion is etched away. Of course, the etching at least the source-drain metal film located in the third photoresist-reserved-portion may be etching the source-drain metal film and the active layer film located in the third photoresist-reserved-portion. In the embodiments of the present disclosure, the case shown in FIG. 6 that the source-drain metal film located in the third photoresist-reserved-portion is etched is described as an example.

Step S106: performing an ashing treatment on the first photoresist-reserved-portion and the second photoresist-reserved-portion to remove the second photoresist-reserved-portion.

Figure 7:
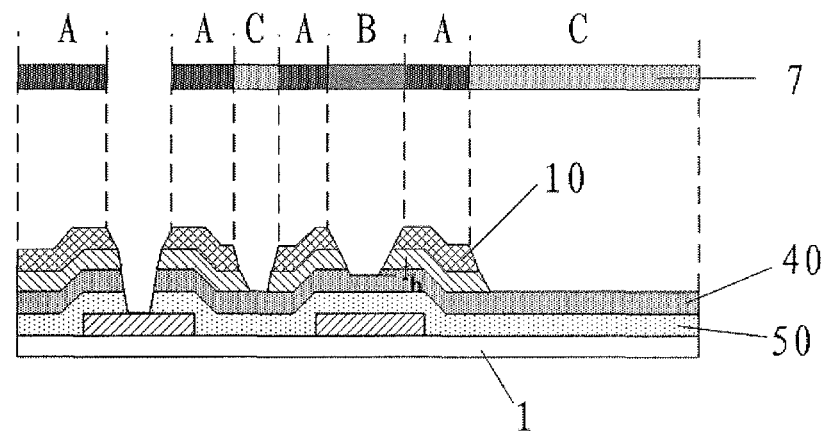
FIG. 7 is a schematic view after the source-drain metal film and a portion of the active layer film in a second photoresist-reserved-portion are etched in the fabrication method of the array substrate according to the embodiments of the present disclosure.

As shown in FIG. 7, the photoresist corresponding to the region B is completely removed, and the photoresist corresponding to the region A is reserved but with a reduced thickness.

Step S107: etching at least the source-drain metal film located in the second photoresist-reserved-portion.

If it is not necessary to etch the active layer, only the source-drain metal film located in the second photoresist-reserved-portion is etched. In the embodiments of the present disclosure, the active layer for example comprises an ohmic contact layer and a semiconductor layer; and in this case, the ohmic contact layer is in contact with the source-drain metal layer and it is also necessary to etch the ohmic contact layer. For example, the etching at least the source-drain metal film located in the second photoresist-reserved-portion is etching the source-drain metal film and a portion of the active layer film located in the second photoresist-reserved-portion; as shown in FIG. 7, the active layer is etched by a thickness of h, and the gate insulating film with the thickness of d reserved in the photoresist-completely-removed-region is etched away to expose the gate metal layer (for example, the pad in the gate metal layer). It should be noted that, while the active layer is etched by the thickness of h, the etching away the gate insulating film with the thickness of d reserved in the photoresist-completely-removed-region is implemented by controlling an etching speed, so that the gate insulating film with the thickness of d reserved in the photoresist-completely-removed-region is completely etched.

Step S108: stripping the remaining photoresist.

Figure 8:
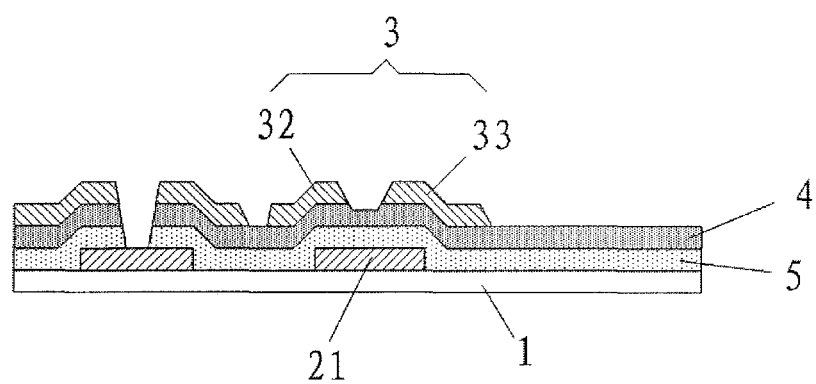
FIG. 8 is a schematic view after remaining photoresist is stripped in the fabrication method of the array substrate according to the embodiments of the present disclosure.

As shown in FIG. 8, the photoresist reserved in the region A is stripped, so as to sequentially form the gate insulating layer 5, the active layer 4 and the source-drain metal layer 3 on the substrate.

It should be noted that, the display device typically displays an image by using an electric field to control transmittance through the liquid crystal. According to a direction of the electric field driving the liquid crystal, the liquid crystal display device is roughly divided into a vertical electric field driven type and a horizontal electric field driven type. The liquid crystal display device of the vertical electric field driven type, such as the liquid crystal display devices of Twist Nematic (TN) type and Vertical Alignment (VA) type, is provided with the common electrode and the pixel electrode opposite to each other respectively on upper and lower substrates (for example, an opposed substrate and the array substrate), to form the vertical electric field between the common electrode and the pixel electrode so as to drive the liquid crystal. The liquid crystal display device of the horizontal electric field driven type, such as the liquid crystal display devices of Advanced-Super Dimensional Switching (ADS) type and In Plane Switch (IPS) type, is provided with the common electrode and the pixel electrode on the lower substrate (for example, the array substrate), to form the horizontal electric field between the common electrode and the pixel electrode so as to drive the liquid crystal.

Figure 9:
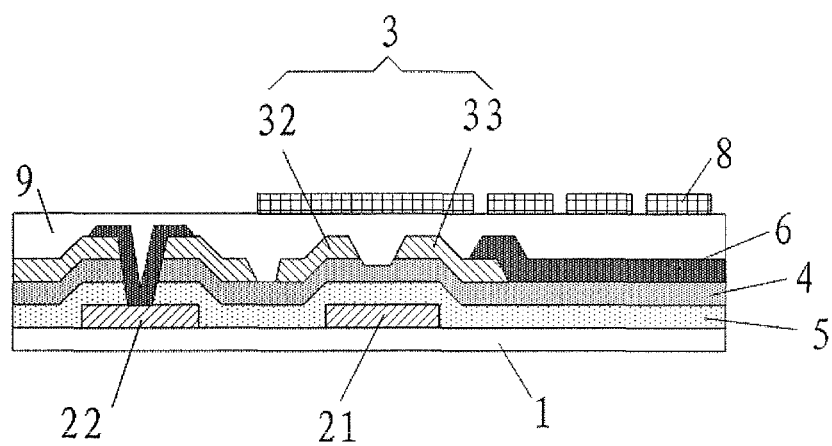
FIG. 9 is a schematic view illustrating another array substrate according to the embodiments of the present disclosure.

For example, the fabrication method further comprises: forming the pixel electrode and the common electrode on the base substrate. The pixel electrode and the common electrode form the electric field. As shown in FIG. 9, the array substrate of the liquid crystal display of the ADS type is taken as an example, the pixel electrode 6 and the common electrode 8 are formed on the array substrate, and the pixel electrode 6 and the common electrode 8 form the horizontal electric field to drive the liquid crystal to implement display. It should be noted that, in the case that the array substrate is provided with the common electrode, the common electrode may be located in the gate metal layer, i.e., the gate metal layer comprises the common electrode, and the common electrode is disposed in a same layer with the gate line and the gate electrode. In addition, in the case that the array substrate is provided with the common electrode, the common electrode may be disposed in a same layer with the pixel electrode. In addition, in the case that the array substrate is provided with the common electrode, the common electrode may be located above the pixel electrode and be insulated from the pixel electrode by a passivation layer 9 as shown in FIG. 9. A positional relationship between the pixel electrode and the common electrode will not be limited by the embodiments of the present disclosure.

For example, the pixel electrode and/or the common electrode comprise strip electrodes. That is, both the pixel electrode and the common electrode comprise the strip electrodes; or, the pixel electrode comprises the strip electrodes and the common electrode is in shape of plate; or, the common electrode comprises the strip electrodes and the pixel electrode is in the shape of plate. Of course, the pixel electrode and the common electrode may be in any other shape such as a comb-like shape. In FIG. 9, the case that the pixel electrode 6 is in the shape of plate and the common electrode 8 comprises the strip electrodes is illustrated as an example.

Embodiments of the present disclosure provide an array substrate. As shown in FIG. 2 and FIG. 8, the array substrate comprises: a gate metal layer, a gate insulating layer 5, an active layer 4 and a source-drain metal layer 3, the gate insulating layer 5, the active layer 4 and the source-drain metal layer 3 are formed by a single patterning process. The gate insulating layer, the active layer and the source-drain metal layer are formed by the method according to the embodiments of the present disclosure through the single patterning process.

As shown in FIG. 2 and FIG. 8, the array substrate comprises a display pixel region a, a connection region b and an isolation region c. The display pixel region a is configured for displaying an image; the connection region b is provided with a via hole, which runs through the source-drain metal layer 3, the active layer 4 and the gate insulating layer 5; the isolation region c is configured for disconnecting a portion of the source-drain metal layer in the display pixel region from a portion of the source-drain metal layer in the connection region. In addition, though not shown, the isolation region c may also disconnect a portion of the active layer in the display pixel region from the portion of the active layer in the connection region.

With reference to the cross-sectional view of the array substrate shown in FIG. 2, the array substrate comprises the display pixel region a, the connection region b and the isolation region c. The display pixel region a is provided with a thin film transistor acting as a switch element, the thin film transistor comprising the gate electrode 21, the source electrode 32 and the drain electrode 33, and the drain electrode 33 is connected with a pixel electrode 6. The connection region b is mainly configured for providing the via hole to implement the electrical connection with a bottom film or pattern. The isolation region c is configured for disconnecting a portion of a layer in the connection region b from a portion of such layer in the display pixel region a. For example, the isolation region c disconnects the portion of the source-drain metal layer in the connection region b from the portion of the source-drain metal layer in the display pixel region a. It should be noted that the connection region may be located at the edge of the base substrate; for example, the gate metal layer comprises the pad 22 located in the connection region, and the pad 22 provided at the edge of the base substrate is electrically connected with an external drive circuit through the via hole.

In the array substrate according to the embodiments of the present disclosure, the via hole in the connection region of the array substrate runs through the source-drain metal layer, the active layer and the gate insulating layer; and compared with a case where the via hole only runs through the gate insulating layer, the resistance of the via hole is reduced and the display effect is further improved.

For example, the source-drain metal layer covers a portion of the connection region. As shown in FIG. 2 and FIG. 8, a region in the connection region except the via hole is provided with the source-drain metal layer. For example, the active layer covers the display pixel region, the connection region except the via hole, and the isolation region. As shown in FIG. 2 and FIG. 8, the active layer not only is disposed between the source electrode and the drain electrode of the display pixel region, but also covers the display pixel region, the connection region except the via hole, and the isolation region.

For example, as shown in FIG. 9, the array substrate further comprises the pixel electrode 6 and the common electrode 8, the pixel electrode 6 and the common electrode 8 form an electric field. That is, the pixel electrode and the common electrode are formed on the array substrate, and the pixel electrode and the common electrode form a horizontal electric field to drive the liquid crystal to implement display. For example, the pixel electrode and/or the common electrode comprise strip electrodes. That is, both the pixel electrode and the common electrode comprise the strip electrodes; or, the pixel electrode comprises the strip electrodes and the common electrode is in shape of plate; or, the common electrode comprises the strip electrodes and the pixel electrode is in the shape of plate. Of course, the pixel electrode and the common electrode may be in any other shape such as a comb-like shape. In FIG. 9, the case that the pixel electrode 6 is in the shape of plate and the common electrode 8 comprises the strip electrodes is illustrated as an example.

It should be noted that, in the case that the array substrate is provided with the common electrode, the common electrode may be located in the gate metal layer, i.e., the gate metal layer comprises the common electrode, and the common electrode is disposed in a same layer with the gate line and the gate electrode. In addition, in the case that the array substrate is provided with the common electrode, the common electrode may be disposed in a same layer with the pixel electrode. In addition, in the case that the array substrate is provided with the common electrode, the common electrode may be located above the pixel electrode and be insulated from the pixel electrode by a passivation layer 9 as shown in FIG. 9. A positional relationship between the pixel electrode and the common electrode will not be limited by the embodiments of the present disclosure.

Embodiments of the present disclosure provide a display device, and the display device comprises the array substrate according to the embodiments of the present disclosure. The display device may be a liquid crystal display, an E-paper, an Organic Light-Emitting Diode (OLED) display or any other display, and any other product or component having a display function which comprises these displays, such as a television, a digital camera, a mobile phone, a tablet personal computer and the like.

The foregoing embodiments merely are exemplary embodiments of the disclosure, and not intended to define the scope of the disclosure, and the scope of the disclosure is determined by the appended claims.

The present application claims priority of Chinese Patent Application No. 201310486484.0 filed on Oct. 17, 2013, the disclosure of which is incorporated herein by reference in its entirety as part of the present application.

The invention claimed is:

1. An array substrate, comprising: a gate metal layer, a gate insulating layer, an active layer and a source-drain metal layer,
    wherein the gate insulating layer, the active layer and the source-drain metal layer are formed by a single patterning process;
    wherein the array substrate is fabricated by:
    forming the gate metal layer, the gate insulating layer, the active layer and the source-drain metal layer on a base substrate, wherein the gate metal layer comprises at least a gate electrode and a metal pad;
    wherein the forming the gate insulating layer, the active layer and the source-drain metal layer on the base substrate comprises:
        forming a gate insulating film, an active layer film, and the source-drain metal film on the base substrate; and
        forming the gate insulating layer, the active layer and the source-drain metal layer by the single patterning process;
    wherein a via hole is formed during the single pattern process, with the via hole penetrating the source-drain metal layer, the active layer and the gate insulating layer and reaching the metal pad.

2. The array substrate according to claim 1, comprising: a display pixel region, a connection region and an isolation region,
    wherein the display pixel region is configured for displaying an image, the connection region is provided with the via hole which runs through the source-drain metal layer, the active layer and the gate insulating layer, and the isolation region is configured for disconnecting a portion of the source-drain metal layer in the display pixel region from a portion of the source-drain metal layer in the connection region.

3. The array substrate according to claim 2, wherein the source-drain metal layer covers the connection region except the via hole.

4. The array substrate according to claim 2, wherein the active layer covers the display pixel region, the connection region except the via hole, and the isolation region.

5. The array substrate according to claim 1, further comprising: a pixel electrode and a common electrode, wherein the pixel electrode and the common electrode are configured to form an electric field therebetween.

6. The array substrate according to claim 5, wherein at least one of the pixel electrode and the common electrode comprises strip electrodes.

7. The array substrate according to claim 5, wherein the common electrode is disposed in a same layer with a gate line and the gate electrode.

8. The array substrate according to claim 5, wherein the common electrode is disposed in a same layer with the pixel electrode.

9. The array substrate according to claim 5, wherein the common electrode is located above the pixel electrode and is insulated from the pixel electrode by a passivation layer.

10. The array substrate according to claim 5, wherein the pixel electrode comprises strip electrodes and the common electrode is in a shape of a plate.

11. The array substrate according to claim 5, wherein the common electrode comprises strip electrodes and the pixel electrode is in a shape of a plate.

12. The array substrate according to claim 5, wherein the pixel electrode and the common electrode each have a comb-like shape.

13. A display device, comprising the array substrate according to claim 1.

14. The display device according to claim 13, wherein the display device is a liquid crystal display device.

15. The display device according to claim 13, wherein the display device is an electronic paper.

16. The display device according to claim 13, wherein the display device is an organic light-emitting diode (OLED) display device.

* * * * *